(12) United States Patent
Chen et al.

(10) Patent No.: US 11,851,784 B2
(45) Date of Patent: Dec. 26, 2023

(54) APPARATUS AND METHOD FOR GROWING HIGH-PURITY SEMI-INSULATING SILICON CARBIDE CRYSTAL

(71) Applicant: Fujian Beidian Material Technologies Co., Ltd., Fujian (CN)

(72) Inventors: Huarong Chen, Fujian (CN); Jie Zhang, Fujian (CN); Hongji Liao, Fujian (CN); Zebin Chen, Fujian (CN)

(73) Assignee: Fujian Beidian Material Technologies Co., Ltd., Fujian (CN)

( * ) Notice: Subject to any disclaimer, the term of this patent is extended or adjusted under 35 U.S.C. 154(b) by 229 days.

(21) Appl. No.: 17/286,358

(22) PCT Filed: Oct. 14, 2019

(86) PCT No.: PCT/CN2019/111083
§ 371 (c)(1),
(2) Date: Apr. 16, 2021

(87) PCT Pub. No.: WO2020/078328
PCT Pub. Date: Apr. 23, 2020

(65) Prior Publication Data
US 2021/0332497 A1    Oct. 28, 2021

(30) Foreign Application Priority Data
Oct. 17, 2018    (CN) .......................... 201811209654.X

(51) Int. Cl.
*C30B 23/06* (2006.01)
*C30B 23/00* (2006.01)
*C30B 29/36* (2006.01)

(52) U.S. Cl.
CPC .......... *C30B 23/005* (2013.01); *C30B 23/066* (2013.01); *C30B 29/36* (2013.01)

(58) Field of Classification Search
CPC ..... C30B 23/00; C30B 23/002; C30B 23/005; C30B 23/02; C30B 23/06; C30B 23/066;
(Continued)

(56) References Cited

U.S. PATENT DOCUMENTS

2005/0257734 A1   11/2005   Madar et al.
2006/0144324 A1    7/2006   Sakaguchi et al.
(Continued)

FOREIGN PATENT DOCUMENTS

CN         1554808 A   * 12/2004
CN       102534763 A     7/2012
(Continued)

OTHER PUBLICATIONS

First Office Action issued by The State Intellectual Property Office of People's Republic of China dated Dec. 11, 2019 for appl. No. 201811209654.X.
(Continued)

*Primary Examiner* — Kenneth A Bratland, Jr.
(74) *Attorney, Agent, or Firm* — IP & T GROUP LLP

(57) ABSTRACT

A high-purity semi-insulating silicon carbide crystal growing apparatus and a method therefor are provided, the apparatus comprising a growth crucible, a bottom part of the growth crucible having inserted a gas pipe, a top part of the growth crucible being provided with a growth crucible cover, a feedstock crucible having a bowl-shaped structure being disposed in the growth crucible, an upper part of the feedstock crucible being provided with a baffle, a bottom part of the feedstock crucible being provided with a ring-shaped supporting feedstock crucible bottom foot, the diameter of the feedstock crucible bottom foot being ⅛ the diameter of the feedstock crucible, and the feedstock crucible bottom foot having disposed thereon 8-36 evenly distributed gas holes.

10 Claims, 1 Drawing Sheet

(58) Field of Classification Search
CPC ......... C30B 29/00; C30B 29/10; C30B 29/36; C30B 35/00; C23C 14/00; C23C 14/06; C23C 14/0635; C23C 14/22; C23C 14/54
USPC ....... 117/84, 88–89, 93, 102, 105, 109, 200, 117/204, 937, 951
See application file for complete search history.

(56) References Cited

U.S. PATENT DOCUMENTS

| | | | | |
|---|---|---|---|---|
| 2013/0280466 | A1* | 10/2013 | Zwieback | B28D 5/00 428/64.1 |
| 2014/0234194 | A1* | 8/2014 | Zwieback | C30B 23/02 118/726 |
| 2015/0068445 | A1* | 3/2015 | Drachev | C30B 23/066 117/84 |
| 2017/0204532 | A1* | 7/2017 | Land | C04B 35/515 |

FOREIGN PATENT DOCUMENTS

| | | | |
|---|---|---|---|
| CN | 104775149 A | 7/2015 | |
| CN | 104805504 A | 7/2015 | |
| CN | 105734671 A | 7/2016 | |
| CN | 205474111 U | 8/2016 | |
| CN | 107059130 A | 8/2017 | |
| CN | 206624942 U | 11/2017 | |
| CN | 107723798 A * | 2/2018 | ........... C30B 23/005 |
| CN | 107723798 A | 2/2018 | |
| CN | 207193434 U | 4/2018 | |
| CN | 108624963 A | 10/2018 | |
| CN | 109402731 A | 3/2019 | |
| JP | 10291899 A * | 11/1998 | |
| KR | 20130035137 A | 4/2013 | |

OTHER PUBLICATIONS

Second Office Action issued by The State Intellectual Property Office of People's Republic of China dated Jun. 29, 2020 for appl. No. 201811209654.X.
International Search Report for International application No. PCT/CN2019/111083 dated Jan. 2, 2020.
Notification to Grant Patent Right for Invention issued by The State Intellectual Property Office of People's Republic of China dated Dec. 28, 2020 for appl. No. 201811209654.X.
Written Opinion of the International Searching Authority for International application No. PCT/CN2019/111083 dated Jan. 2, 2020.
First Search of Priority Document for application No. CN201811209654X filed on Oct. 17, 2018.
Supplementary Search of Priority Document for application No. CN201811209654X filed on Oct. 17, 2018.

* cited by examiner

_US 11,851,784 B2_

APPARATUS AND METHOD FOR GROWING HIGH-PURITY SEMI-INSULATING SILICON CARBIDE CRYSTAL

CROSS-REFERENCE TO RELATED APPLICATION

This application is a national stage application of PCT/CN2019/111083 filed on Oct. 14, 2019, which claims priority of Chinese patent application with the filing number CN201811209654.X filed on Oct. 17, 2018 with the Chinese Patent Office, and entitled "High-purity Semi-insulating Silicon Carbide Crystal Growing Apparatus and Method therefor", the contents of which are incorporated herein by reference in entirety.

TECHNICAL FIELD

The present disclosure relates to the technical filed of semiconductor manufacturing apparatus, in particular, to a high-purity semi-insulating silicon carbide crystal growing apparatus (i.e. apparatus for growing a high-purity semi-insulating silicon carbide crystal) and a method therefor.

BACKGROUND ART

At present, physical vapor deposition (PVT) is the main growth method for silicon carbide single crystal growth, which has been proven to be the most mature method for growing SiC crystals. When it is used to grow high-purity semi-insulating silicon carbide crystals, the high-purity SiC powder is heated to 2200~2500° C., and under the protection of inert atmosphere, it is sublimated to the cold end seed crystal and crystallized into a bulk crystal.

This process not only needs to establish a suitable temperature field to form a stable transport flow of vapor phase SiC from high temperature to low temperature, but also enables that the vapor phase SiC may form a good growth interface growth on the seed crystal, and at the same time, impurity incorporation should be avoided, the background impurity concentration is controlled at $5\times10^{17}$ cm$^3$, and intrinsic point defects are added by annealing process to compensate for the difference of energy levels between shallow acceptor and shallow donor. At present, the mainstream uses inert gas to clean the thermal field and uses chlorine gas to clean the thermal field. However, the crucible is made of graphite. Graphite has a strong chemical affinity with impurities such as N and B. Therefore, the high-purity semi-insulating crystal currently produced can only reach 10E5-9Ω resistance.

Chinese patent CN104775149A discloses a method for growing high-purity semi-insulating silicon carbide single crystal, which is realized by the following apparatus for growing high-purity semi-insulating silicon carbide: the apparatus includes a growth chamber, a lower part of the growth chamber is connected with an atmospheric isolation chamber, the atmospheric isolation chamber is provided with an operation window, one side of the atmosphere isolation chamber is connected to a transition chamber, and a heating apparatus for removing impurities and others are provided in the transition chamber. The apparatus provided by the invention pretreats insulating materials and the crucible for growing SiC single crystal, and introduces specific gases during the single crystal growth process, thus effectively reducing the donor impurity N, acceptor impurity B and metal ion impurities in the SiC single crystal, and improving the resistivity. But the crucible used in this patent cannot be reused.

SUMMARY

In view of the above-mentioned problems, the present disclosure provides a high-purity semi-insulating silicon carbide crystal growing apparatus and a method therefor.

The technical solutions adopted by the present disclosure to solve the above-mentioned problems comprises: a high-purity semi-insulating silicon carbide crystal growing apparatus, including a growth crucible 6, wherein a bottom part of the growth crucible 6 is inserted with a gas pipe 7; a top part of the growth crucible 6 is provided with a growth crucible cover 5; a feedstock crucible 2 in a bowl-shaped structure is disposed inside the growth crucible 6; an upper part of the feedstock crucible 2 is provided with a baffle 1; a bottom part of the feedstock crucible 2 is provided with a feedstock crucible bottom foot 3 for ring-shaped supporting; a diameter of the feedstock crucible bottom foot 3 is ⅛ of a diameter of the feedstock crucible 2; and the feedstock crucible bottom foot 3 is provided thereon with 8~36 evenly distributed gas holes 4. In the above, the diameter of the baffle is 2 mm~8 mm larger than the diameter of the feedstock crucible, which can prevent the silicon carbide powder from adhering to the crystal growth surface with the sublimed gas, causing defects in inclusions or micropipes; the gas holes provided on the feedstock crucible foot allow introduced gas to be blown along an inner wall of the growth crucible from bottom to top. The blowing groove and blowing function can isolate the wall of the growth crucible from the reaction gas, avoid the introduction of impurities in the growth crucible into the feedstock gas, and greatly reduce the background concentration of impurities such as N and B in the crystal, and also may prevent the feedstock gas from adhering to the crucible wall and reacting with the crucible wall; the outer diameter of the feedstock crucible is 2 mm~10 mm smaller than the inner diameter of the growth crucible; and the growth crucible is made of a graphite material and has a wall thickness of 5 mm~20 mm.

Further, the material of the feedstock crucible 2 is high-purity high-density graphite.

Further, the surface of the feedstock crucible 2 is provided with any one of a Nb coating and a Ta coating.

Further, the material of the baffle 1 is one selected from the group consisting of porous graphite and porous graphite fiber. In the above, the baffle of this material is selected so that the baffle has a good permeation filtering properties.

Further, the surface of the baffle 1 is provided with any one of a Nb coating and a Ta coating.

Further, the dimensions of the gas holes 4 are: 1 mm~5 mm in height and 5 mm~10 mm in width.

Another objective of the present disclosure is to provide a silicon carbide crystal growing method for the above-mentioned high-purity semi-insulating silicon carbide crystal growing apparatus, which includes the following steps:

Step S10, putting silicon carbide powder 8 with purity of 5 N~6 N into the feedstock crucible 2, covering the feedstock crucible with the baffle 1, and putting the feedstock crucible into a groove at the bottom part of the growth crucible 6, installing the growth crucible cover 5 with seed crystal 9 into the growth crucible 6, and wrapping an insulating layer around the growth crucible cover 5 and the bottom part of the growth crucible 6;

Step S20, evacuating the inside of the growth crucible 6 to a pressure less than $5\times10^{-2}$ mbar, introducing argon gas with the pressure controlled at 600 mbar~800 mbar, turning on a water-cooled induction coil to energize and heat the feedstock crucible 2 by induction, and performing blowing by introducing 200 sccm~800 sccm of gas through the gas pipe 7, and keeping, when heated to a temperature of 1950° C.~2050° C., the temperature for 1 hour~5 hours; and Step S30, reducing the flow rate of gas introduced into the gas pipe to control the flow rate at 5 sccm~30 sccm, continuously introducing the gas into the gas pipe 7, adjusting the flow rate of the gas introduced into the cavity so as to control the pressure at 5 mbar~100 mbar, and continuing to raise the temperature to 2050° C.~2250° C., and depositing and crystallizing for 5~10 days to obtain the high-purity semi-insulating silicon carbide crystal.

Further, in Step S10, the insulating layer is 1~4 layers of graphite soft felt with a thickness of 5 mm~10 mm.

Further, in Step S20, the gas is any one selected from the group consisting of an inert gas, hydrogen gas and a mixed gas of the two.

Further, the gas is a mixed gas of inert gas argon gas and hydrogen gas.

The advantages of the present disclosure are:

(1) The high-purity semi-insulating silicon carbide crystal growing apparatus of the present disclosure uses the feedstock crucible of a special material, thus avoiding direct contact between silicon carbide feedstock and graphite, causing the silicon carbide feedstock to be isolated from the growth crucible, preventing impurities of the growth crucible and N and B included in the insulating layer from entering the feedstock, and preventing introduction of impurities into the growth process;

(2) The bottom part of the high-purity semi-insulating silicon carbide crystal growing apparatus of the present disclosure is provided with the gas pipe for gas introduction, and the gas is blown along the inner wall of the growth crucible from bottom to top. The blowing groove and blowing function can isolate the wall of the growth crucible from the reaction gas, avoid the introduction of impurities in the growth crucible into the feedstock gas, greatly reduce the background concentration of impurities such as N and B in the crystal, and also may prevent feedstock gas from adhering to the crucible wall and reacting with the crucible wall;

(3) The feedstock crucible of the present disclosure is provided with a specially treated porous graphite baffle to prevent feedstock particles from adhering to the crystal growth surface with the sublimed gas, causing defects in inclusions or micropipes; and (4) The feedstock crucible and growth crucible of the high-purity semi-insulating silicon carbide crystal growing apparatus of the present disclosure can be recycled and reused, which greatly reduces the production cost.

In addition to the objectives, features, and advantages described above, the present disclosure further has other objectives, features, and advantages. Hereinafter, the present disclosure will be further described in detail with reference to the drawings.

BRIEF DESCRIPTION OF DRAWINGS

In order to more clearly illustrate the examples of the present disclosure or technical solutions in the prior art, accompanying drawings which need to be used for description of the examples or the prior art will be introduced briefly below, and apparently, the accompanying drawings in the following description merely show some examples of the present disclosure, and those ordinarily skilled in the art still could obtain other drawings in light of these accompanying drawings, without using any inventive efforts. In the accompanying drawings.

Figure 1:
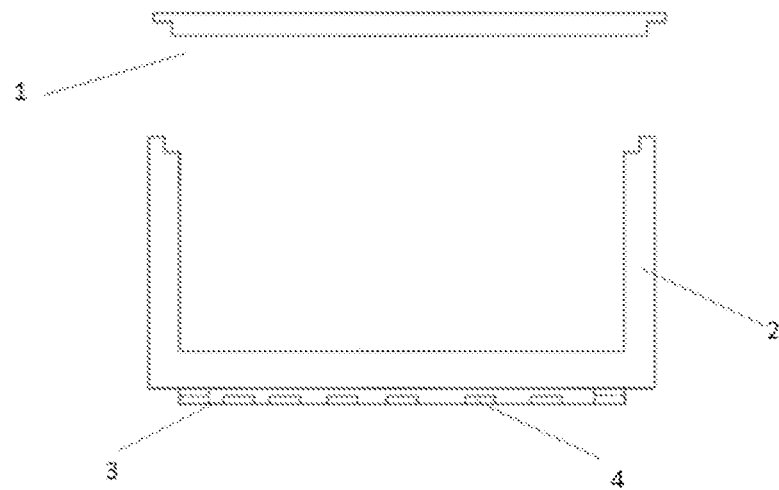
FIG. 1 is a schematic view of a feedstock crucible apparatus.
Figure 2:
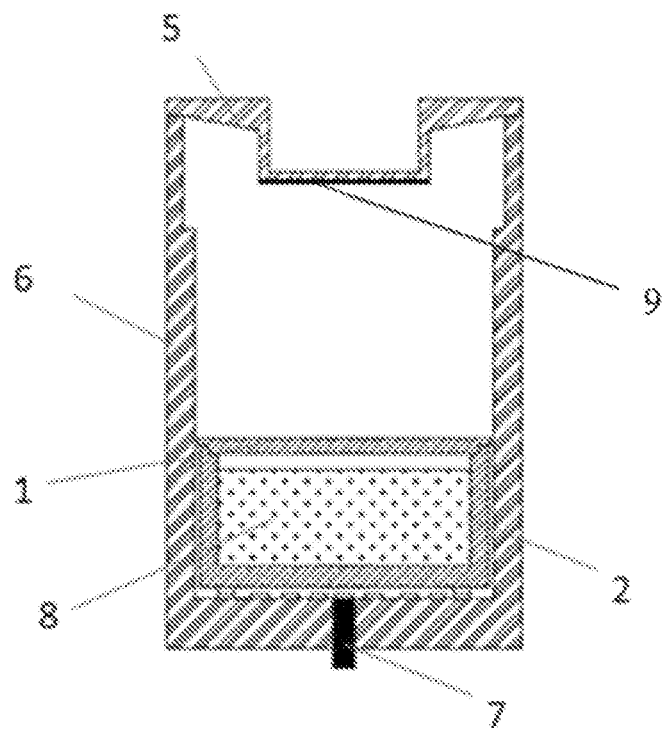
FIG. 2 is a sectional view of a growth apparatus.

The reference signs in the figures are: 1—baffle; 2—feedstock crucible; 3—feedstock crucible bottom foot; 4—gas hole; 5—growth crucible cover; 6—growth crucible; 7—gas pipe; 8—silicon carbide powder; 9—seed crystal.

DETAILED DESCRIPTION OF EMBODIMENTS

The technical solutions in the examples of the present disclosure will be clearly and completely described below in combination with the accompanying drawings in the examples of the present disclosure, and obviously, the examples described are part of the examples of the present disclosure, rather than all examples. Based on the examples of the present disclosure, all other examples obtained by those ordinarily skilled in the art, without making inventive effort, fall within the protection scope of the present disclosure.

Example 1

A High-Purity Semi-Insulating Silicon Carbide Crystal Growing Apparatus and a Method Therefor The high-purity semi-insulating silicon carbide crystal growing apparatus includes a growth crucible, a bottom part of the growth crucible is inserted with a gas pipe; a top part of the growth crucible is provided with a growth crucible cover; a feedstock crucible in a bowl-shaped structure is disposed inside the growth crucible, an outer diameter of the feedstock crucible is 6 mm smaller than an inner diameter of the growth crucible; an upper part of the feedstock crucible is provided with a baffle; a bottom part of the feedstock crucible is provided with a feedstock crucible bottom foot for ring-shaped supporting; a diameter of the feedstock crucible bottom foot is ⅛ of a diameter of the feedstock crucible; and the feedstock crucible bottom foot is provided thereon with 24 evenly distributed gas holes. In the above, the material of the feedstock crucible is high-purity high-density graphite, and the feedstock crucible is coated with a tantalum carbide coating; the material of the baffle is porous graphite fiber, and the baffle is provided with a tantalum carbide coating on the surface, and has the diameter 3 mm larger than the diameter of the feedstock crucible; the dimensions of the gas holes are: 3 mm in height and 8 mm in width; and the growth crucible is made of a graphite material and has a wall thickness of 10 mm.

A silicon carbide crystal growing method for the above-mentioned high-purity semi-insulating silicon carbide crystal growing apparatus includes the following steps:

Step S10, putting 1 kg of silicon carbide powder with purity of 5 N~6 N into the feedstock crucible, covering the feedstock crucible with the baffle, and putting the feedstock crucible into a groove at the bottom part of the growth crucible, installing into the growth crucible the growth crucible cover with 4 inches 4H seed crystal, and wrapping an insulating layer around the growth crucible cover and the bottom part of the growth crucible, wherein the insulating layer is 3 layers of graphite soft felt with a thickness of 6 mm;

Step S20, evacuating the inside of the growth crucible to a pressure less than $5 \times 10^{-2}$ mbar, introducing argon gas with the pressure controlled at 700 mbar, turning on a water-cooled induction coil to energize and heat the feedstock crucible by induction, and introducing 600 sccm of argon gas through the gas pipe for blowing, and keeping when heated to 1970° C., the temperature for 2 hours; and Step S30, reducing the flow rate of gas entering the gas pipe to control the flow rate at 5 sccm, continuously introducing the gas into the gas pipe, adjusting the flow rate of argon gas introduced into the cavity so as to control the pressure at 5 mbar~50 mbar, and continuing to raise the temperature to 2150° C., and depositing and crystallizing for 6 days to obtain the high-purity semi-insulating silicon carbide crystal.

The 4H high-purity semi-insulating silicon carbide crystal and wafers grown in the present example are transparent, and have no inclusion observed under strong light and polarizer and no polycrystal at the edge. The resistance value at each position measured by E+H is greater than $8 \times 10^{11} \Omega$.

Example 2

A High-Purity Semi-Insulating Silicon Carbide Crystal Growing Apparatus and a Method Therefor The high-purity semi-insulating silicon carbide crystal growing apparatus includes a growth crucible, a bottom part of the growth crucible is inserted with a gas pipe; a top part of the growth crucible is provided with a growth crucible cover; a feedstock crucible in a bowl-shaped structure is disposed inside the growth crucible, an outer diameter of the feedstock crucible is 2 mm smaller than an inner diameter of the growth crucible; an upper part of the feedstock crucible is provided with a baffle; a bottom part of the feedstock crucible is provided with a feedstock crucible bottom foot for ring-shaped supporting; a diameter of the feedstock crucible bottom foot is ⅛ of a diameter of the feedstock crucible; and the feedstock crucible bottom foot is provided thereon with 10 evenly distributed gas holes. In the above, the material of the feedstock crucible is high-purity high-density graphite, and the feedstock crucible is coated with a Nb coating; the material of the baffle is porous graphite, and the baffle is provided with a Nb coating on the surface, and has the diameter 6 mm larger than the diameter of the feedstock crucible; the dimensions of the gas holes are: 5 mm in height and 10 mm in width; and the growth crucible is made of a graphite material and has a wall thickness of 15 mm.

A silicon carbide crystal growing method for the above-mentioned high-purity semi-insulating silicon carbide crystal growing apparatus includes the following steps:

Step S10, putting 1.5 kg of silicon carbide powder with purity of 5 N into the feedstock crucible, covering the feedstock crucible with the baffle, and putting the feedstock crucible into a groove at the bottom part of the growth crucible, installing into the growth crucible the growth crucible cover with 4 inches 4H seed crystal, and wrapping an insulating layer around the growth crucible cover and the bottom part of the growth crucible, wherein the insulating layer is 2 layers of graphite soft felt with a thickness of 8 mm;

Step S20, evacuating the inside of the growth crucible to a pressure less than $5 \times 10^{-2}$ mbar, introducing argon gas with the pressure controlled at 600 mbar, turning on a water-cooled induction coil to energize and heat the feedstock crucible by induction, and introducing 700 sccm of hydrogen gas through the gas pipe for blowing, and keeping, when heated to 2050° C., the temperature for 3 hours; and Step S30, reducing the flow rate of gas entering the gas pipe to control the flow rate at 10 sccm, continuously introducing the gas into the gas pipe, adjusting the flow rate of hydrogen gas introduced into the cavity so as to control the pressure at 10 mbar~50 mbar, and continuing to raise the temperature to 2100° C., and depositing and crystallizing for 10 days to obtain the high-purity semi-insulating silicon carbide crystal.

The 4H high-purity semi-insulating silicon carbide crystal and wafers grown in the present example are transparent, and have no inclusion observed under strong light and polarizer and no polycrystal at the edge. The resistance value at each position measured by E+H is greater than $8 \times 10^{11} \Omega$.

Example 3

A High-Purity Semi-Insulating Silicon Carbide Crystal Growing Apparatus and a Method Therefor The high-purity semi-insulating silicon carbide crystal growing apparatus includes a growth crucible, a bottom part of the growth crucible is inserted with a gas pipe; a top part of the growth crucible is provided with a growth crucible cover; a feedstock crucible in a bowl-shaped structure is disposed into the growth crucible, an outer diameter of the feedstock crucible is 8 mm smaller than an inner diameter of the growth crucible; an upper part of the feedstock crucible is provided with a baffle; a bottom part of the feedstock crucible is provided with a feedstock crucible bottom foot for ring-shaped supporting; a diameter of the feedstock crucible bottom foot is ⅛ of a diameter of the feedstock crucible; and the feedstock crucible bottom foot is provided thereon with 8 evenly distributed gas holes. In the above, the material of the feedstock crucible is high-purity high-density graphite, and the feedstock crucible is coated with a Ta coating; the material of the baffle is porous graphite fiber, and the baffle is provided with a Nb coating on the surface, and has the diameter 4 mm larger than the diameter of the feedstock crucible; the dimensions of the gas holes are: 1 mm in height and 9 mm in width; and the growth crucible is made of a graphite material and has a wall thickness of 5 mm.

A silicon carbide crystal growing method for the above-mentioned high-purity semi-insulating silicon carbide crystal growing apparatus includes the following steps:

Step S10, putting 2 kg of silicon carbide powder with purity of 6 N into the feedstock crucible, covering the feedstock crucible with the baffle, and putting the feedstock crucible into a groove at the bottom part of the growth crucible, installing into the growth crucible the growth crucible cover with 4 inches 4H seed crystal, and wrapping an insulating layer around the growth crucible cover and the bottom part of the growth crucible, wherein the insulating layer is 4 layers of graphite soft felt with a thickness of 5 mm;

Step S20, evacuating the inside of the growth crucible to a pressure less than $5 \times 10^{-2}$ mbar, introducing argon gas with the pressure controlled at 750 mbar, turning on a water-cooled induction coil to energize and heat the feedstock crucible by induction, and introducing 800 sccm of the mixed gas of hydrogen gas and argon gas through the gas pipe for blowing, and keeping, when heated to 2000° C., the temperature for 1 hour; and Step S30, reducing the flow rate of gas entering the gas pipe to control the flow rate at 20 sccm, continuously introducing the gas into the gas pipe, adjusting the flow rate of the gas introduced into the cavity so as to control the pressure at 50 mbar~100 mbar, and continuing to raise the temperature to 2050° C., and performing depositing and crystallizing for 8 days, to obtain the high-purity semi-insulating silicon carbide crystal.

The 4H high-purity semi-insulating silicon carbide crystal and wafers grown in the present example are transparent, and have no inclusion observed under strong light and polarizer and no polycrystal at the edge. The resistance value at each position measured by E+H is greater than $8\times10^{11}\Omega$.

Example 4

A High-Purity Semi-Insulating Silicon Carbide Crystal Growing Apparatus and a Method Therefor The high-purity semi-insulating silicon carbide crystal growing apparatus includes a growth crucible, a bottom part of the growth crucible is inserted with a gas pipe; a top part of the growth crucible is provided with a growth crucible cover; a feedstock crucible in a bowl-shaped structure is disposed into the growth crucible, an outer diameter of the feedstock crucible is 4 mm smaller than an inner diameter of the growth crucible; an upper part of the feedstock crucible is provided with a baffle; a bottom part of the feedstock crucible is provided with a feedstock crucible bottom foot for ring-shaped supporting; a diameter of the feedstock crucible bottom foot is 1/8 of a diameter of the feedstock crucible; and the feedstock crucible bottom foot is provided thereon 36 evenly distributed gas holes. In the above, the material of the feedstock crucible is high-purity high-density graphite, and the feedstock crucible is coated with a Nb coating; the material of the baffle is porous graphite, and the baffle is provided with a Ta coating on the surface, and has the diameter 2 mm larger than the diameter of the feedstock crucible; the dimensions of the gas holes are: 4 mm in height and 6 mm in width; and the growth crucible is made of a graphite material and has a wall thickness of 20 mm.

A silicon carbide crystal growing method for the above-mentioned high-purity semi-insulating silicon carbide crystal growing apparatus includes the following steps:

Step S10, putting 1 kg of silicon carbide powder with purity of 5 N~6 N into the feedstock crucible, covering the feedstock crucible with the baffle, and putting the feedstock crucible into a groove at the bottom part of the growth crucible, installing into the growth crucible the growth crucible cover with 4 inches 4H seed crystal, and wrapping an insulating layer around the growth crucible cover and the bottom part of the growth crucible, wherein the insulating layer is 1 layer of graphite soft felt with a thickness of 10 mm;

Step S20, evacuating the inside of the growth crucible to a pressure less than $5\times10^{-2}$ mbar, introducing argon gas with the pressure controlled at 650 mbar, turning on a water-cooled induction coil to energize and heat the feedstock crucible by induction, and introducing 200 sccm of argon gas through the gas pipe for blowing, and keeping, when heated to 1950° C., the temperature for 5 hours; and Step S30, reducing the flow rate of gas entering the gas pipe to control the flow rate at 30 sccm, continuously introducing the gas into the gas pipe, adjusting the flow rate of argon gas introduced into the cavity so as to control the pressure at 5 mbar~50 mbar, and continuing to raise the temperature to 2250° C., and depositing and crystallizing for 5 days to obtain the high-purity semi-insulating silicon carbide crystal.

The 4H high-purity semi-insulating silicon carbide crystal and wafers grown in the present example are transparent, and have no inclusion observed under strong light and polarizer and no polycrystal at the edge. The resistance value of the resistance at each position measured by E+H is greater than $8\times10^{11}\Omega$.

Example 5

A High-Purity Semi-Insulating Silicon Carbide Crystal Growing Apparatus and a Method Therefor The high-purity semi-insulating silicon carbide crystal growing apparatus includes a growth crucible, a bottom part of the growth crucible is inserted with a gas pipe; a top part of the growth crucible is provided with a growth crucible cover; a feedstock crucible in a bowl-shaped structure is disposed into the growth crucible, an outer diameter of the feedstock crucible is 10 mm smaller than an inner diameter of the growth crucible; an upper part of the feedstock crucible is provided with a baffle; a bottom part of the feedstock crucible is provided with a feedstock crucible bottom foot for ring-shaped supporting; a diameter of the feedstock crucible bottom foot is 1/8 of a diameter of the feedstock crucible; and the feedstock crucible bottom foot is provided thereon with 30 evenly distributed gas holes. In the above, the material of the feedstock crucible is high-purity high-density graphite, and the feedstock crucible is coated with a Ta coating; the material of the baffle is porous graphite, and the baffle is provided with a Nb coating on the surface, and has the diameter 8 mm larger than the diameter of the feedstock crucible; the dimension of the gas holes is: 2 mm in height and 5 mm in width; and the growth crucible is made of a graphite material and has a wall thickness of 15 mm.

A silicon carbide crystal growing method for the above-mentioned high-purity semi-insulating silicon carbide crystal growing apparatus, which includes the following steps:

Step S10, putting 1.5 kg of silicon carbide powder with purity of 6 N into the feedstock crucible, covering the feedstock crucible with the baffle, and putting the feedstock crucible into a groove at the bottom part of the growth crucible, installing into the growth crucible the growth crucible cover with 4 inches 4H seed crystal, and wrapping an insulating layer around the growth crucible cover and the bottom part of the growth crucible, wherein the insulating layer is 2 layers of graphite soft felt with a thickness of 6 mm;

Step S20, evacuating the inside of the growth crucible to a pressure less than $5\times10^{-2}$ mbar, introducing argon gas with the pressure controlled at 800 mbar, turning on a water-cooled induction coil to energize and heat the feedstock crucible by induction, and introducing 400 sccm of argon gas through the gas pipe for blowing, and keeping, when heated to 2050° C., the temperature for 4 hours; and Step S30, reducing the flow rate of gas entering the gas pipe to control the flow rate at 25 sccm, continuously introducing the gas into the gas pipe, adjusting the flow rate of argon gas introduced into the cavity so as to control the pressure at 5 mbar~10 mbar, and continuing to raise the temperature to 2150° C., and depositing and crystallizing for 7 days to obtain the high-purity semi-insulating silicon carbide crystal.

The 4H high-purity semi-insulating silicon carbide crystal and wafers grown in the present example are transparent, and have no inclusion observed under strong light and polarizer and no polycrystal at the edge. The resistance value of the resistance at each position measured by E+H is greater than $8\times10^{11}\Omega$.

The above are only preferred examples of the present disclosure, and are not used to limit the present disclosure. For those skilled in the art, the present disclosure can have various modifications and changes. Any modification, equivalent replacement and improvement and so on made within the spirit and principle of the present disclosure shall be included in the protection scope of the present disclosure.

What is claimed is:

1. A silicon carbide crystal growing method using an apparatus for growing a semi-insulating silicon carbide crystal, the semi-insulating silicon carbide crystal comprising a growth crucible, wherein a bottom part of the growth crucible is inserted with a gas pipe; a top part of the growth crucible is provided with a growth crucible cover; a feedstock crucible in a bowl-shaped structure is disposed inside the growth crucible; an upper part of the feedstock crucible is provided with a baffle; a bottom part of the feedstock crucible is provided with a feedstock crucible bottom foot for ring-shaped supporting; a diameter of the feedstock crucible bottom foot is ⅛ of a diameter of the feedstock crucible; the feedstock crucible bottom foot is provided with 8~36 gas holes which are evenly distributed, the method comprising following steps:

Step S10, putting silicon carbide powder with purity of 5 N~6 N into the feedstock crucible, covering the feedstock crucible with the baffle, putting the feedstock crucible into a groove at the bottom part of the growth crucible, installing into the growth crucible the growth crucible cover with seed crystal, and wrapping an insulating layer around the growth crucible cover and the bottom part of the growth crucible;

Step S20, evacuating the inside of the growth crucible to a pressure less than $5 \times 10^{-2}$ mbar, introducing argon gas with a pressure controlled at 600 mbar~800 mbar, turning on a water-cooled induction coil to energize and heat the feedstock crucible by induction, and introducing 200 sccm~800 sccm of gas selected from the group consisting of inert gas, hydrogen gas, and a mixed gas of the two through the gas pipe for blowing along an inner wall of the growth crucible from bottom to top, and keep, when heated to a temperature of 1950° C.~2050° C., the temperature for 1 hour~5 hours; and Step S30, reducing a flow rate of the gas entering the gas pipe to control the flow rate at 5 sccm~30 sccm, continuously introducing the gas into the gas pipe, adjusting the flow rate of the gas introduced into a cavity so as to control a pressure at 5 mbar~100 mbar, and continuing to raise the temperature to 2050° C.~2250° C., and depositing and crystallizing for 5~10 days to obtain the semi-insulating silicon carbide crystal.

2. The silicon carbide crystal growing method according to claim 1, wherein in Step S10, the insulating layer is 1~4 layers of graphite soft felt with a thickness of 5 mm~10 mm.

3. The silicon carbide crystal growing method according to claim 1, wherein the gas is a mixed gas of inert gas which is argon gas and hydrogen gas.

4. The silicon carbide crystal growing method according to claim 1, wherein a material of the feedstock crucible is graphite.

5. The silicon carbide crystal growing method according to claim 1, wherein a surface of the feedstock crucible is provided with any one of a Nb coating and a Ta coating.

6. The silicon carbide crystal growing method according to claim 1, wherein a material of the baffle is one selected from the group consisting of porous graphite and porous graphite fiber.

7. The silicon carbide crystal growing method according to claim 1, wherein a surface of the baffle is provided with any one of a Nb coating and a Ta coating.

8. The silicon carbide crystal growing method according to claim 1, wherein dimensions of the gas holes are: 1 mm~5 mm in height and 5 mm~10 mm in width.

9. The silicon carbide crystal growing method according to claim 1, wherein a surface of the feedstock crucible is provided with any one of a NiC coating and a TaC coating.

10. The silicon carbide crystal growing method according to claim 1, wherein a surface of the baffle is provided with any one of a NiC coating and a TaC coating.

* * * * *